United States Patent [19]

Amemiya et al.

[11] 4,081,800
[45] Mar. 28, 1978

[54] ANALOG-TO-DIGITAL CONVERTER

[75] Inventors: Hiroshi Amemiya, Fujisawa; Tadaaki Tarui, Kawasaki; Tsuneo Yoneyama, Yokosuka, all of Japan

[73] Assignee: Tokyo Shibaura Electric Co., Ltd., Kawasaki, Japan

[21] Appl. No.: 625,035

[22] Filed: Oct. 23, 1975

[30] Foreign Application Priority Data

Oct. 24, 1974  Japan .................. 49-121926
Oct. 24, 1974  Japan .................. 49-121929

[51] Int. Cl.² ........................................ H03K 13/20
[52] U.S. Cl. ............................................ 340/347 NT
[58] Field of Search ................ 340/347 NT, 347 AD

[56] References Cited

U.S. PATENT DOCUMENTS

| | | | |
|---|---|---|---|
| 3,735,394 | 5/1973 | Eto | 340/347 NT |
| 3,750,146 | 7/1973 | Lucas | 340/347 NT |
| 3,818,246 | 6/1974 | Heilwarth | 340/347 NT |
| 3,826,983 | 7/1974 | Garratt | 340/347 NT |
| 3,828,347 | 8/1974 | Sacks | 340/347 NT |
| 3,833,902 | 9/1974 | Eto | 340/347 NT |
| 3,842,416 | 10/1974 | Eto | 340/347 NT |
| 3,872,466 | 3/1975 | Wold | 340/347 NT |
| 3,906,486 | 9/1975 | Phillips | 340/347 NT |
| 3,942,173 | 3/1976 | Wold | 340/347 NT |

*Primary Examiner*—Charles D. Miller
*Attorney, Agent, or Firm*—Oblon, Fisher, Spivak, McClelland & Maier

[57] ABSTRACT

Disclosed is an analog-to-digital converter comprising an analog switch for selecting one of analog input voltage, and first and second different reference potentials; an integrator including at least one integration resistor to which is applied the output of said analog switch, a D.C. amplifier having an inversion input terminal to which is applied the output of said analog switch through said integration resistor and a non-inversion input terminal to which is applied a potential equal to an intermediate value between said first and second reference potentials, and an integration capacitor connected between the output terminal of said D.C. amplifier and said inversion input terminal; an analog comparator having one input terminal connected to the output terminal of the D.C. amplifier and the other input terminal to which is applied a third reference potential; and a control circuit for controlling the change-over operation of said analog switch in response to the output of said analog comparator, wherein said control circuit is designed to make control so that the first reference potential is first integrated by the integrator for a specified length of time $T_1$ and then the second reference potential is integrated and a length of time $T_2$ from the start of this integration until the third reference potential is crossed by the output of the integrator is measured and a length of time $T_3$ is determined by correcting the $T_1$ in accordance with the measurement results and the analog input voltage is integrated for the length of time $T_3$ and thereafter the second reference voltage is integrated and a length of time $T_4$ from the start of this integration until the third reference potential is crossed by the integrator output is measured, thereby to obtain a digital output corresponding to the analog input voltage from the lengths of time $T_3$ and $T_4$.

11 Claims, 12 Drawing Figures

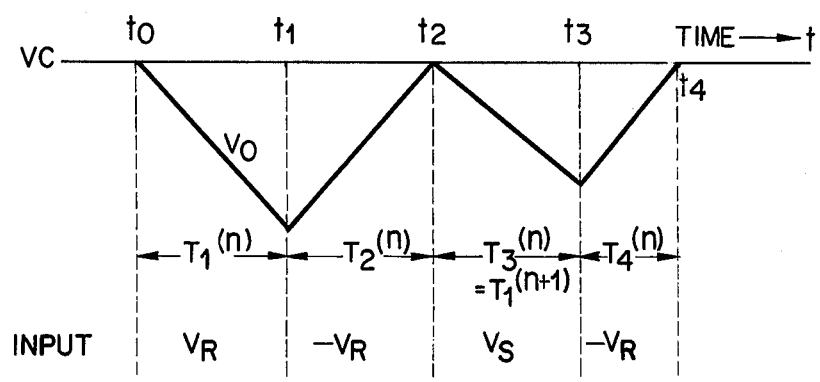
F I G. 5

F I G. 11
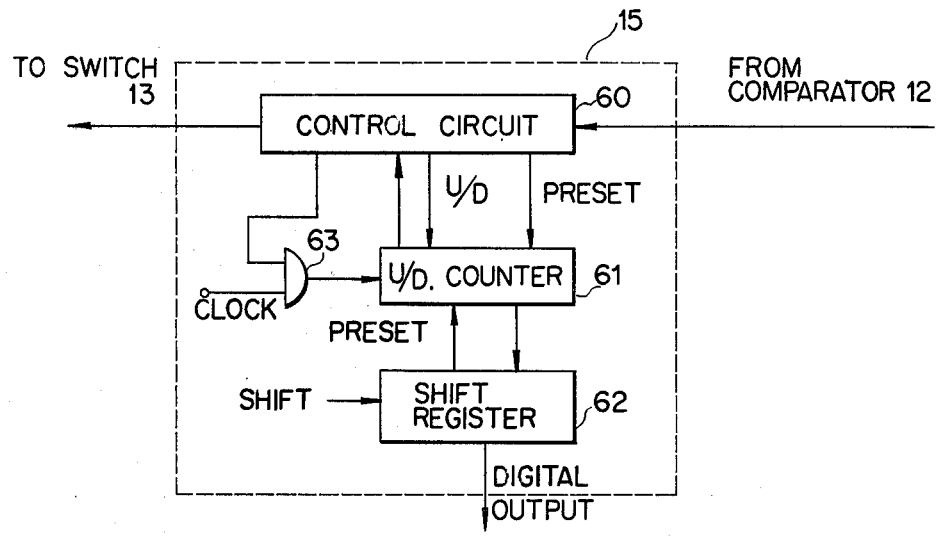
F I G. 12
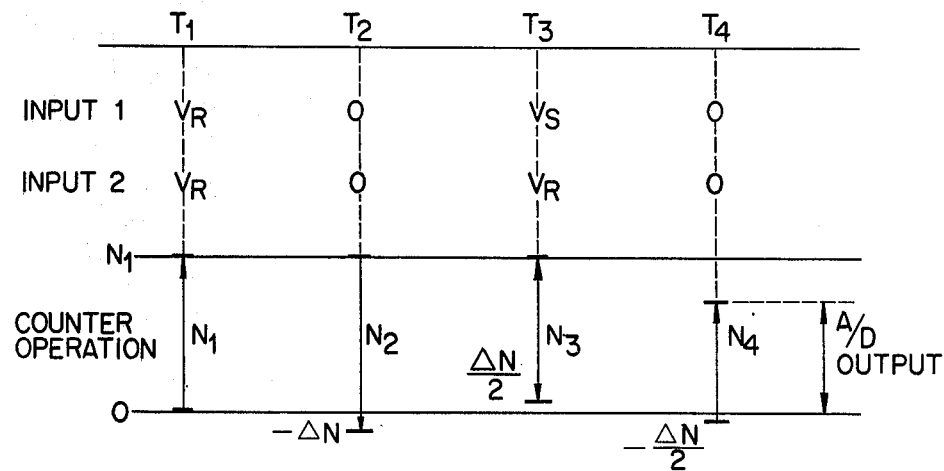

ANALOG-TO-DIGITAL CONVERTER

BACKGROUND OF THE INVENTION

This invention relates to an analog-to-digital converter, and more particularly to an analog-to-digital converter capable of automatically performing the zero adjustment and the full scale adjustment.

An analog-to-digital converter (which is hereinafter abbreviated to "A-D converter") of dual slope type (for example, shown in U.S. Pat. No. 3,316,547) is conventionally known as among the A-D converters. In principle, this type of A-D converter comprises, as shown in FIG. 1, a D.C. amplifier 1, an integrator composed of an input resistor R and an integration capacitor C, a comparator 2, and a change-over switch 3, and is so constructed that an input voltage $V_S$ and a reference voltage $-V_R$ being applied to an input terminal 4 may properly be changed over by the change-over switch 3 to determine a digital amount of the input voltage $V_S$. As shown in FIG. 2, the positive input voltage $V_S$ is first applied to the terminal 4 for a specified length of time $T_1$ to decrease the output voltage $V_O$ of the D.C. amplifier applied to the positive input terminal of the comparator 2. Then, a voltage being applied to the input terminal 4 is changed over to the negative reference voltage $-V_R$ to increase the above output voltage $V_0$, and a length of time $T_2$ required until an output is produced from the comparator 2 after said output voltage $V_0$ reaches the reference level $V_C$ applied to the negative input terminal of the comparator 2 is measured. If, at this time, the potential of the inversion input terminal of the D.C. amplifier 1 is zero, that is to say, if there is no offset, the following relation will be established.

$$\frac{V_S}{V_R} = \frac{T_2}{T_1} \quad (1)$$

The $T_1$ and $T_2$ are determined by counting the number of clock pulses by, for example, counters. Accordingly, the ratio of the input $V_S$ to the reference voltage $V_R$, ($V_S/V_R$), is determined as the ratio of the count during the length of time $T_2$ to the count during the length of time $T_1$ ($T_2/T_1$)(= digital amount).

In the case where there is no offset at the D.C. amplifier 1 as mentioned above, an exact measurement can be made of the input voltage $V_S$. Generally, however, the above equation (1) does not hold true due to the offset of the D.C. amplifier 1. That is, if the offset voltage is represented by $\Delta V$, $$\frac{V_S}{V_R} = (1 - \frac{\Delta V}{V_R}) \frac{T_2}{T_1} - \frac{\Delta V}{V_R} \quad (2)$$

Accordingly, an error attributed to the offset voltage $\Delta V$ is produced. Accordingly, the above input voltage $V_S$ was usually measured after the operating voltage of the D.C. amplifier was manually adjusted so as to compensate the offset voltage $\Delta V$. Since, however, the $\Delta V$ is subjected to change with time or with temperature, an exact measurement would require the zero adjustment or full scale adjustment each time the measurement is made.

In order to correct such errors originating in the $\Delta V$, such a method as shown in FIG. 3 is conventionally proposed. Parts and sections of FIG. 3 the same as those of FIG. 1 are denoted by the same reference numerals. In the arrangement of FIG. 3, the output end of the D.C. amplifier 1 is grounded through a switch 5 and a capacitor 6, and a connection point between the switch 5 and the capacitor 6 is connected to the gate electrode of an FET 7, and the source electrode of the FET 7 is connected to a terminal 8 of the change-over switch 3, thus to construct an A-D converter. The source of the FET 7 is connected to a power source of $-B$ through a resistor, while the drain thereof is connected to a power source of $+B$.

In this circuit arrangement, the common terminal 4 in the change-over switch 3 is first connected to the terminal 8 and simultaneously the switch 5 is closed. As a result, a current determined by $\Delta V/R$ flows in the resistor R to charge the capacitor C of the integrator. When the circuit has been brought to a stationary condition, the voltage at the inversion input terminal of the D.C. amplifier 1 and the source voltage of the FET 7 are equalized and current ceases to flow in the resistor R. At this time, the source voltage of the FET 7 relative to the earth potential is $-\Delta V$, while the voltage across the terminals of the capacitor 6 has such a level as permits the source voltage of the FET 7 relative to the earth potential to be $-\Delta V$.

When, at this time, the switch 5 is opened and the change-over switch 3 is so changed over as to connect the common terminal 4 to a terminal supplied with the input voltage $V_S$, a voltage of $V_S - \Delta V$ is integrated. When, after this integration is made for a length of time $T_1$, the changeover switch 3 is so changed over as to connect the terminal 10 to the terminal 4, with the switch 5 kept open, a voltage of $-V_R - \Delta V$ is integrated. When it is assumed that a length of time required from the change-over of the switch until the integration output goes across the reference level (0 level) is represented by $T_2$, the following equation is established.

$$(V_S - \Delta V + \Delta V)T_1 + (-V_R - \Delta V + \Delta V)T_2 = 0$$

Accordingly, $V_S T_1 = V_R T_2$. That is to say, $$\frac{V_S}{V_R} = \frac{T_2}{T_1}$$

Namely, the method of FIG. 3 consists in connecting the terminal 4 to the terminal 8 thereby to produce at the inversion input terminal of D.C. amplifier 1 beforehand a voltage $-\Delta V$ (as expressed in terms of analog value) whose polarity is opposite to that of the offset voltage $\Delta V$ of the D.C. amplifier 1, and upon actual measurement adding this voltage $-\Delta V$ to the $V_S$ and $-V_R$ thereby to correct errors as resulting from the $\Delta V$.

According to the above-mentioned method, therefore, the zero adjustment and the full scale adjustment can be carried out by closing the switch 5 for each measurement to obtain beforehand a corresponding voltage being added to the offset voltage.

However, the above-mentioned conventional A-D converter has the following drawbacks.

First, where an attempt is made to effect the converter miniaturization by converting a circuit for effecting the error correction into an integrated circuit form (IC form), the existence of the capacitor 6 prevents a completion of said circuit into an IC form. Second, in order to produce a voltage of $-\Delta V$ there are required the switch 5 and the capacitor 6, which should however be extremely small in terms of current orrect leak. That is, if there occurs a current leak, variations will take place in the analog level of $-\Delta V$ during the period for actual measurement, leading to a failure to perform an exact A-D conversion. Third, where it is desired to produce beforehand a voltage having a specified level of $-\Delta V$, stabilization of the circuit under a condition of the power source being turned ON must be waited, and therefore a long time is required until an actual measurement becomes possible after the power source is turned ON. Fourth, where the input voltage $V_S$ is 0, a dual slope is not produced. It is therefore impossible to perform an A-D conversion in the case of the input voltage $V_S = 0$.

SUMMARY OF THE INVENTION

The object of the invention is to provide an A-D converter capable of automatically correcting with a sufficiently high precision the errors originating in the offset voltage of the D.C. amplifier, that is, automatically performing the zero adjustment and the full scale adjustment with so high a precision.

The characterizing feature of the invention resides in that the errors resulting from the offset voltage $\Delta V$ are determined as the errors measured in terms of time length, whereby these time length errors are dealt with as digital amounts. Since, as a result, means for determining the amount of errors to be corrected are constructed all by digital circuits, the A-D converter of the invention is difficultly subjected to yearly change or change with temperature, is easy to convert into an IC form, and makes the fast measurements possible.

BRIEF DESCRIPTION OF THE DRAWING

FIG. 5 is a graph for explaining the operation of the A-D converter shown in FIG. 4;

FIG. 11 is a block circuit diagram showing an example of the control circuit of FIG. 8; and FIG. 12 is a graph for explaining the operation of the U/D (up/down or reversible) counter shown in FIG. 11.

DETAILED DESCRIPTION OF THE PREFERRED EMBODIMENTS

Figure 1:
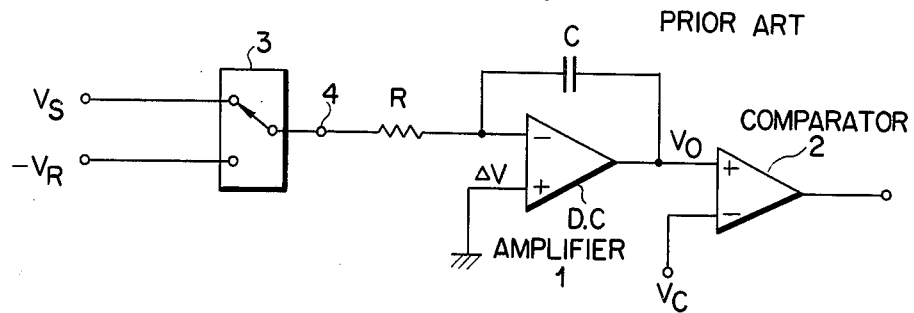
FIG. 1 is a block circuit diagram showing the principle of a prior art A-D converter of dual slope type.
Figure 2:
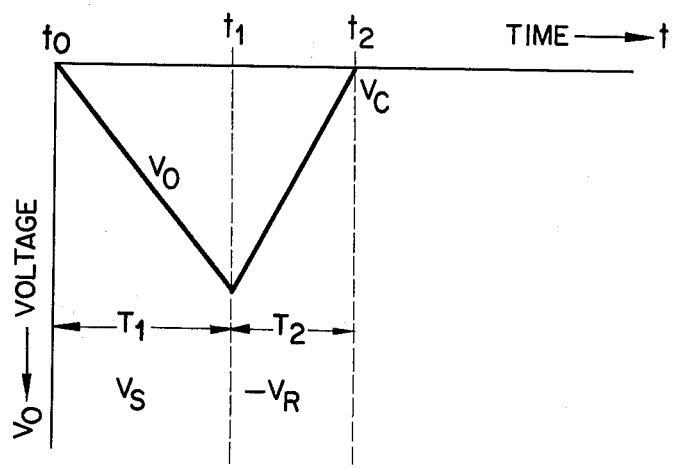
FIG. 2 is a graph for explaining the operation of the A-D converter of FIG. 1.
Figure 3:
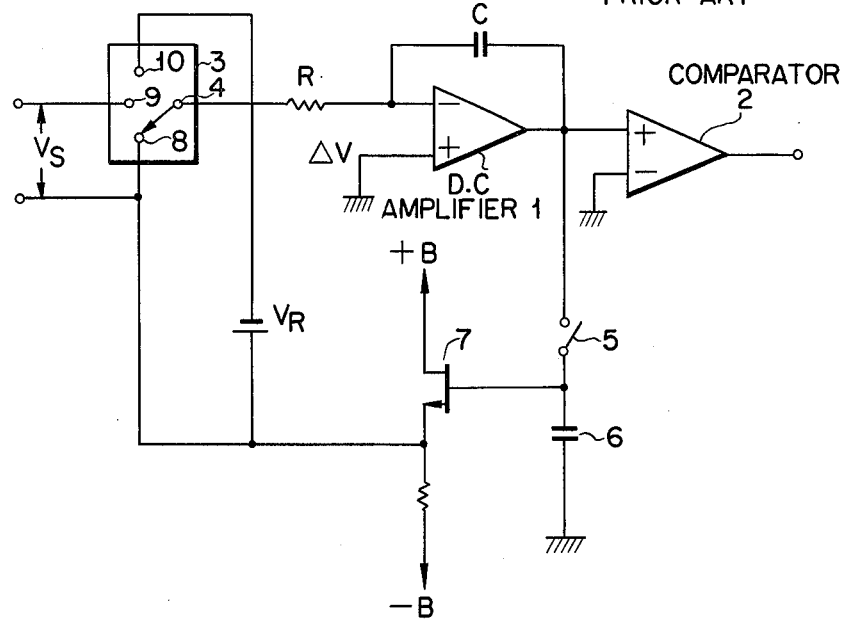
FIG. 3 is a block circuit diagram showing an example of the conventional dual slope type A-D converter having the function to correct errors due to the offset voltage $\Delta V$.
Figure 4:
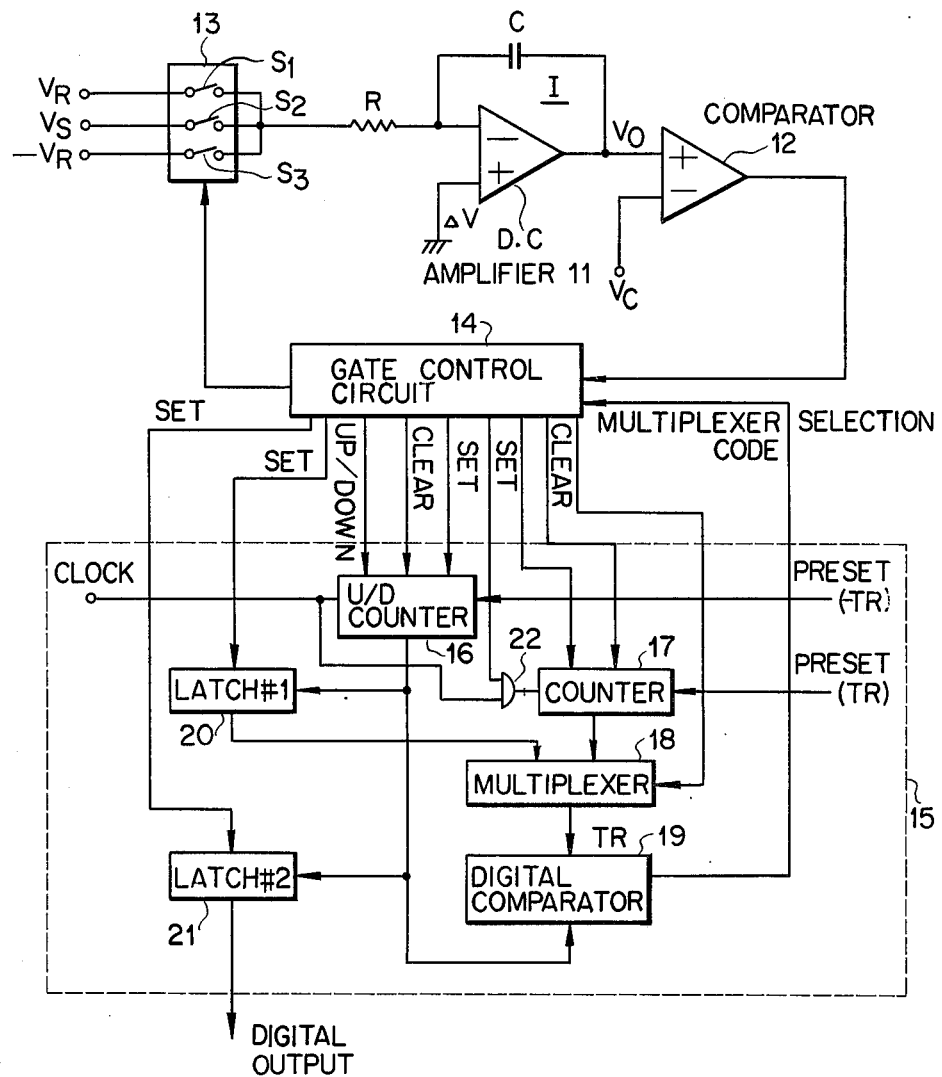
FIG. 4 is a block circuit diagram showing an A-D converter according to an embodiment of the invention.

Hereinafter, this invention is described in detail by reference to the accompanying drawings. FIG. 4 shows an analog-to-digital converter according to an embodiment of the invention. In FIG. 4, a reference numeral 11 denotes a D.C. amplifier, 12 an analog comparator, 13 a change-over switch, 14 a gate control circuit, and 15 an operation control circuit. An input resistor R is connected to an inversion input terminal of the D.C. amplifier 11, and an integration capacitor C is connected between the inversion input terminal and an output terminal of the D.C. amplifier 11 to form an integrated circuit I. A non-inversion input terminal of the D.C. amplifier 11 is grounded. The operation control circuit 15 shown enclosed by a dotted line comprises up/down (U/D) counter or reversible counter 16, a counter 17 for counting the integration time, a multiplexer 18, a digital comparator 19, and first and second latches 20 and 21, and these constituent elements are controlled by the gate control circuit 14.

When it is now assumed that a power source switch be closed, the above-mentioned respective counters and registers are set to an initial condition by clear pulses generated from the gate control circuit 14. Further, the gate control circuit 14 acts as follows. Where the input voltage applied to a positive input terminal of the comparator 12, that is, the output voltage $V_O$ of the D.C. amplifier 11 is higher than a reference level $V_C$ for comparison applied to a negative input terminal of the comparator 12, an analog switch $S_1$ in the change-over switch 13 is turned ON to cause a reference voltage $V_R$ to be applied to the integration circuit I and, when the integration output $V_O$ becomes equal to the reference level $V_C$, the switch $S_1$ is opened. Conversely, where the $V_O$ is lower than the $V_C$, another analog switch $S_3$ in the change-over switch 13 is closed to cause a reference voltage $-V_R$ to be applied to the integration circuit I and, when the $V_O$ becomes equal to the $V_C$, the switch $S_3$ is opened. Further, simultaneously with the closure of the power source switch an initial value $T_R$ is preset in the counter 17 for counting the integration time. The $T_R$ is the time representing the amount of reference voltage $V_R$ A-D converted. For example, in the case where, when the reference voltage $V_R$ is 10V, its amount after A-D converted is desired to be 512, the $T_R$ is determined as 512. Upon completion of the initial condition-setting in this way, the actual measuring operation commences to be carried out. But for convenience of explanation, the operation of principle of the invention will now be explained using FIG. 5.

FIG. 5 shows the output waveform of the integration circuit I of the A-D converter of the invention shown in FIG. 4, i.e., the output voltage waveform of the D.C. amplifier 11. First, the reference voltage $V_R$ is integrated for a specified length of time $T_1$. Next, the reference voltage $-V_R$ is integrated and a length of time $T_2$ from the staff of this integration until the reference level $V_C$ is crossed is measured. Next, $T_3$ is determined by correcting the $T_1$ utilizing the measured length of time $T_2$, and the input voltage $V_S$ is integrated for the length of time $T_3$, and thereafter the reference voltage $-V_R$ is integrated and a length of time $T_4$ from the start of this integration until the reference level $V_C$ is crossed is measured. That is to say, the $T_1$ and $T_2$ are the periods during which to obtain a data for correction by using the reference voltages $V_R$ and $-V_R$, and the $T_3$ and $T_4$ are the periods during which actual measurement or A-D conversion is made for the length of integration time corrected in accordance with the obtained correction data.

The main point of the operation of the A-D converter of the invention resides in that, upon actual measurement, a specified length of time during which the input voltage $V_S$ is integrated is determined with high precision by using the corrected length of integration time $T_3$ as the next measuring cycle of $T_1$ as mentioned above. Each time the frequency at which this determining operation is performed is increased, an error in terms of said specified length of time becomes sequentially small and therefore even where there is a considerably large offset, an exact measurement can be made of the input voltage $V_S$.

The above-mentioned principle of the operation of the A-D converter of the invention is hereinafter described in more detail.

When it is now assumed that $T_1$ and $T_2$ at the time of nth-time correction are represented by $T_1^{(n)}$ and $T_2^{(n)}$, respectively, and that $T_3$ and $T_4$ at the time of actual measurement are represented by $T_3^{(n)}$ and $T_4^{(n)}$, respectively, the following equation is obtained.

$$T_3^{(n)} = T_1^{(n+1)}$$

Considering similarly to the previously mentioned equation (2), $$\frac{V_S}{V_R} = (1 - \frac{\Delta V}{V_R}) \frac{T_4^{(n)}}{T_3^{(n)}} - \frac{\Delta V}{V_R} \quad (3)$$

$$\text{If} \frac{1 - \frac{\Delta V}{V_R}}{T_3^{(n)}} = \frac{1}{T_R} \quad (4),$$

$$\frac{V_S}{V_R} = \frac{T_4^{(n)}}{T_R} - \frac{\Delta V}{V_R} \quad (5).$$

Since from the above equation (4)

$$\frac{\Delta V}{V_R} = 1 - \frac{T_3^{(n)}}{T_R} \quad (6),$$

the following equation results.

$$\frac{V_S}{V_R} = \frac{T_4^{(n)} + T_3^{(n)} - T_R}{T_R} \quad (7)$$

Accordingly, if $T_R$ is a length of time corresponding to the reference voltage $V_R$, that is, a length of time representing the amount of reference voltage $V_R$ A-D converted, the $T_4^{(n)} + T_3^{(n)} - T_R$ will be a length of time corresponding to the input voltage $V_S$. Therefore, the digital amount of input voltage $V_S$ A-D converted is obtained by counting the time length $T_4^{(n)} + T_3^{(n)} - T_R$. Accordingly, control has simply to be so made that $T_1^{(n)}$ is corrected into $T_3^{(n)}$ so as to permit the equation (4) to hold ture.

The above equation (3) is written in the form used for actual measurement, an in the case of considering this in terms of correcting time, i.e., in the case of $V_S = V_R$, $$1 = (1 - \frac{\Delta V}{V_R}) \frac{T_2^{(n)}}{T_1^{(n)}} - \frac{\Delta V}{V_R} \quad (8)$$

Accordingly, $$\frac{\Delta V}{V_R} = \frac{T_2^{(n)} - T_1^{(n)}}{T_1^{(n)} + T_2^{(n)}} \quad (9)$$

Therefore, in order that the equation (4) may be established, the following equation has only to be satisfied.

$$T_3^{(n)} = (1 - \frac{\Delta V}{V_R}) T_R \quad (10)$$
$$= \frac{2T_1^{(n)} T_R}{T_1^{(n)} + T_2^{(n)}}$$
$$= T_1^{(n)} + \frac{T_1^{(n)}}{T_1^{(n)} + T_2^{(n)}} (2T_R - T_1^{(n)} - T_2^{(n)})$$

Since, generally, $\Delta V/V_R \ll 1$ in the equation (10), the following is obtained as the primary approximation.

$$\frac{T_1^{(n)}}{T_1^{(n)} + T_2^{(n)}} = \frac{1}{2}$$

Accordingly, $$T_3^{(n)} = T_1^{(n)} + \tfrac{1}{2}(2T_R - T_1^{(n)} - T_2^{(n)}) \quad (11)$$

This equation is an approximation equation of correction for establishing the equation (4). As understood from the equations (10) and (11), if $2T_R = T_1^{(n)} + T_2^{(n)}$, the errors originating in the $\Delta V$ are zeroed, and as a result $T_3^{(n)} = T_1^{(n)}$.

Next, it is shown that as the value of n is increased, the errors are converged.

What is determined from the actual measurement is the right side of the equation (7), and the error between the value thus obtained and the true value of $V_S/V_R$ is as follows.

$$\frac{T_4^{(n)} + T_3^{(n)} - T_R}{T_R} - \frac{V_S}{V_R} \quad (12)$$

Substituting the equations $$\frac{T_4^{(n)}}{T_3^{(n)}} = \frac{V_S + \Delta V}{V_R - \Delta V} \text{ and } \frac{T_2^{(n)}}{T_1^{(n)}} = \frac{V_R + \Delta V}{V_R - \Delta V},$$

and the above equation (11) into the equation (12), the equation (12) can be rewritten as follows.

$$V_{ERROR}^{(n)} = \frac{\Delta V}{V_R} \cdot \frac{V_R + V_S}{V_R - \Delta V} \cdot (1 - \frac{V_R}{V_R - \Delta V} \cdot \frac{T_1^{(n)}}{T_R}) \quad (13)$$

Therefore, $$V_{ERROR}^{(n+1)} = \frac{\Delta V}{V_R} \cdot \frac{V_R + V_S}{V_R - \Delta V} (1 - \frac{V_R}{V_R - \Delta V} \cdot \frac{T_1^{(n+1)}}{T_R}) \quad (14)$$

$$T_1^{(n+1)} = T_3^{(n)} = T_1^{(n)} + \frac{1}{2}(2T_R - T_1^{(n)} - T_2^{(n)}) \quad (15)$$

$$V_{ERROR}^{(n+1)} = -\frac{\Delta V}{V_R} \cdot \frac{V_R + V_S}{V_R - \Delta V} \cdot \frac{\Delta V}{V_R - \Delta V}$$
$$\cdot (1 - \frac{V_R}{V_R - \Delta V} \cdot \frac{T_1^{(n)}}{T_R})$$
$$= -\frac{\Delta V}{V_R - \Delta V} \cdot V_{ERROR}^{(n)} \quad (16)$$

Since, generally, $$|\frac{\Delta V}{V_R - \Delta V}| < 1, |\frac{V_{ERROR}^{(n)}}{V_{ERROR}^{(n+1)}}| < 1$$

As seen from this equation, the error is monotone decreasing. Accordingly, the error decreases with an increase in the value of n to be converged into zero. To give $T_R$ as the $T_1^{(1)}$ in a cycle of first correction, the following is obtained from the equation (13).

$$V_{ERROR}^{(1)} = \frac{\Delta V}{V_R} \cdot \frac{V_R + V_S}{V_R - \Delta V} (1 - \frac{V_R}{V_R - \Delta V}) \quad (17)$$

$$= -\frac{V_R + V_S}{V_R} (\frac{\Delta V}{V_R - \Delta V})^2$$

Therefore, $$V_{ERROR}^{(n)} = (-1)^n \frac{V_R + V_S}{V_R} (\frac{\Delta V}{V_R - \Delta V})^{n+1} \quad (18)$$

That is to say, $V_{ERROR}^{(n)}$ is maximum when $V_S = V_R$ and minimum when $V_S = 0$. The way how the error varies with a variation in the value of n under a condition of $V_S = V_R$ is shown in Table 1, provided $$|\frac{\Delta V}{V_R - \Delta V}| = 0.1.$$

Table 1

| n | $V_{ERROR}^{(n)}$ |
|---|---|
| 1 | 0.02 |
| 2 | 0.002 |
| 3 | 0.0002 |

As understood from the above Table 1, the error becomes 0.02, or 1/50 after subject to the first correction. Since, this value is situated between 1/32 and 1/64, it results in the case of actual measurement that an A-D conversion precision of 5 bits is secured. Similarly, if the second correction is performed the secured A-D conversion precision will become 8 bits, and if the third correction is performed, the secured A-D conversion precision will become 11 bits.

Through conducting at least one correccction as above described, the A-D conversion precision can be increased. Next, turning back to FIG. 4, explanation is further made of the A-D converter of the invention which is capable of executing the above-mentioned principle.

Upon completion of the initial condition-setting in the previously mentioned way, the gate control circuit 14 is so operated as to close the analog switch $S_1$ in the change-over switch 13 and set to a count up condition the U/D counter or reversible counter 16 in the operation control circuit 15 and send a selection code to the multiplexer 18 so as to supply the content of the counter 17 into the multiplexer 18. As a result, the integration circuit I integrates the reference voltage $R_R$, and the output $V_O$ thereof starts to fall as shown in FIG. 5 and simultaneously the U/D counter or reversible counter 16 counts the number of clock pulses to cause its count to be up. The output of the reversible counter 16 is supplied to the digital comparator 19, which compares a count value sent from the reversible counter 16 with a $T_R$ value delivered from the counter 17. When the count-up operation of the reversible counter 16 goes on for the time length $T_1$ and the count value thereof has become $T_R$, the digital comparator 19 produces a signal "1". This signal is supplied to the gate control circuit 14, which, upon receipt of that signal, causes the analog switch $S_1$ to be opened and also causes the switch $S_3$ to be closed, and simultaneously causes the reversible counter 16 to be set to a count-down condition. As a result, the integration circuit I integrates the reference voltage $-V_R$, and the output $V_O$ thereof starts to rise in the period $T_2$ as shown in FIG. 5 while the content of the reversible counter 16 is decreased one by one for each receipt of clock pulses.

When the output $V_O$ of the integration circuit I continues to rise and goes across the reference level $V_C$ supplied to the comparator 12 after the lapse of time $T_2$, the output level of the comparator 12 is inverted from "0" to "1". This inverted output is sent to the gate control circuit 14, which, upon receipt of that output signal, supplies a setting signal to the first latch 20. As a result, the first latch 20 stores therein the content of the reversible counter 16 at that time-$(T_1-T_2)$. Further, the gate control circuit 14 transmits a clear pulse to the counter 17 upon receipt of the inverted output of the comparator 12 and simultaneously causes the reversible counter 16 to be again set to a count-up condition. Further, the gate control circuit 14 clears the reversible counter 16 with a slight delay from the time when the setting signal has been sent to the first latch 20, and then transmits a set pulse to the reversible counter 16 and at the same time a selection code to the multiplexer 18. A signal $-T_R$ is coupled to the setting input of the reversible counter 16, which, upon receipt of said set pulse, causes the $-T_R$ signal to be preset. Further, the multiplexer 18 permits the passage therethrough of the content of the first latch 20 to the digital comparator 19 upon receipt of said selection code. Since, at this time, the output of the first latch 20 is coupled to the input of the multiplexer 18 in a manner shifted one digit to a lower order, a comparing input being supplied to the digital comparator 19 is $\frac{1}{2}(T_1-T_2)$.

Further, the gate control circuit 14 produces a control signal for causing the analog switch $S_3$ in the change-over switch 13 to be opened and simultaneously causing the switch $S_2$ to be closed, and simultaneously causes the AND gate 22 to be opened. Accordingly, the input voltage $V_S$ is integrated, and the output voltage $V_O$ of the integration circuit I starts to fall once again from a time point $t_2$ as shown in FIG. 5, and further the reversible counter 16 continues its count-up operation from the value of $-T_R$. When this count-up operation is continued and the count value becomes the above-mentioned $\frac{1}{2}(T_1-T_2)$, the digital comparator 19 again produces the "1" signal. Assuming that a length of time required from the time when the reversible counter 16 starts its count-up operation from the $-T_R$ to the time when the digital comparator 19 produces the "1" signal is represented by $T_3$, $$-T_R + T_3 = \frac{1}{2}(T_1 - T_2)$$

That is to say, $$T_3 = T_R + \frac{1}{2}(T_1 - T_2)$$

In the counter 17 for counting the integration time, its count is rendered "up" from the cleared state for the time length $T_3$. It results, accordingly, that the content $T_3$ of the counter 17 represents $T_R + \frac{1}{2}(T_1 - T_2)$. That is the $T_R$ to which the counter 17 is initially set is now changed into the above value of $T_R + \frac{1}{2}(T_1 - T_2)$.

Further, the gate control circuit 14, upon receipt of the output signal of the digital comparator 19, produces a signal for causing the analog switch $S_2$ to be opened and simultaneously causing the swtich $S_3$ to be closed. Further, the reversible counter 16 is successively kept in a count-up condition. As a result, the integration circuit I integrates the reference voltage $-V_R$, and the output voltage $V_O$ thereof rises again from a time point $t_3$ as shown in FIG. 5 and the reversible counter 16 continues its count-up operation. When the output $V_O$ of the integration circuit I reaches again the reference level $V_C$, the output of the comparator 12 is inverted from "0" to "1". The gate control circuit 14 receives this signal "1" and transmits a set pulse to the second latch 21 thereby to transfer the content of the reversible counter 16 to the second latch 21. Assuming that a length of time during which the reference voltage $-V_R$ is integrated is represented by $T_4$, the content of the reversible counter 16, i.e., the content being stored in the second latch 21 is $-T_R + T_3 + T_4$. Since $T_3 = T_R + \frac{1}{2}(T_1 - T_2)$ as previously mentioned, the content being stored in the second latch 21 can be also said to be $T_4 + \frac{1}{2}(T_1 - T_2)$.

The value of $T_4 + \frac{1}{2}(T_1 - T_2)$ corresponds to the numerator of the right side of the above equation (7). As apparent from the foregoing explanation, the voltage applied during the time length $T_R$ is the reference voltage $V_R$ and, since the $T_3 + T_4 - T_R$ is stored in the second latch 21 at the time of completing the actual measurement, the value of $T_3 + T_4 - T_R$ stored in the second latch 21 is a digital amount of the input voltage $V_S$. If, accordingly, the content of the second latch 21 is read out under the above-stored condition, the amount of input voltage $V_S$ A-D converted has been subject to the first correction can be obtained.

However, the value of $T_3$ obtained by correcting the initial preset value $T_R$, i.e., the value of $T_R + \frac{1}{2}(T_1 - T_2)$ is allowed to remain in the integration time counter 17. If, accordingly, the same operation as mentioned above is carried out considering this $T_3$ as $T_1$ in the next measuring cycle, the error correction can be performed with a higher precision. Since, in this embodiment, the error correction is performed for each measurement was described above, the correction precision can be enhanced for each increase in the frequency of measurement as apparent also from the above-mentioned principle of operation.

The foregoing description refers to the case where the $T_1$ and $T_2$ represent the periods for obtaining data for error correction and the $T_3$ and $T_4$ represent the periods during which actual measurement is conducted using the integration time as corrected on the basis of the correction data. But arrangement may be so made that the reference voltage $V_R$ is once again applied during the period of $T_3$ and then the reference voltage $-V_R$ is applied during the period of $T_4$ and thereafter the same operation is repeated several times thereafter to carry out the actual measurement. The repetitive operation of the correcting cycle at this time is executed utilzing a spare time between the actual measurements. By so doing, an exact amount to be corrected can be always determined in advance of actual measurement.

Figure 6:
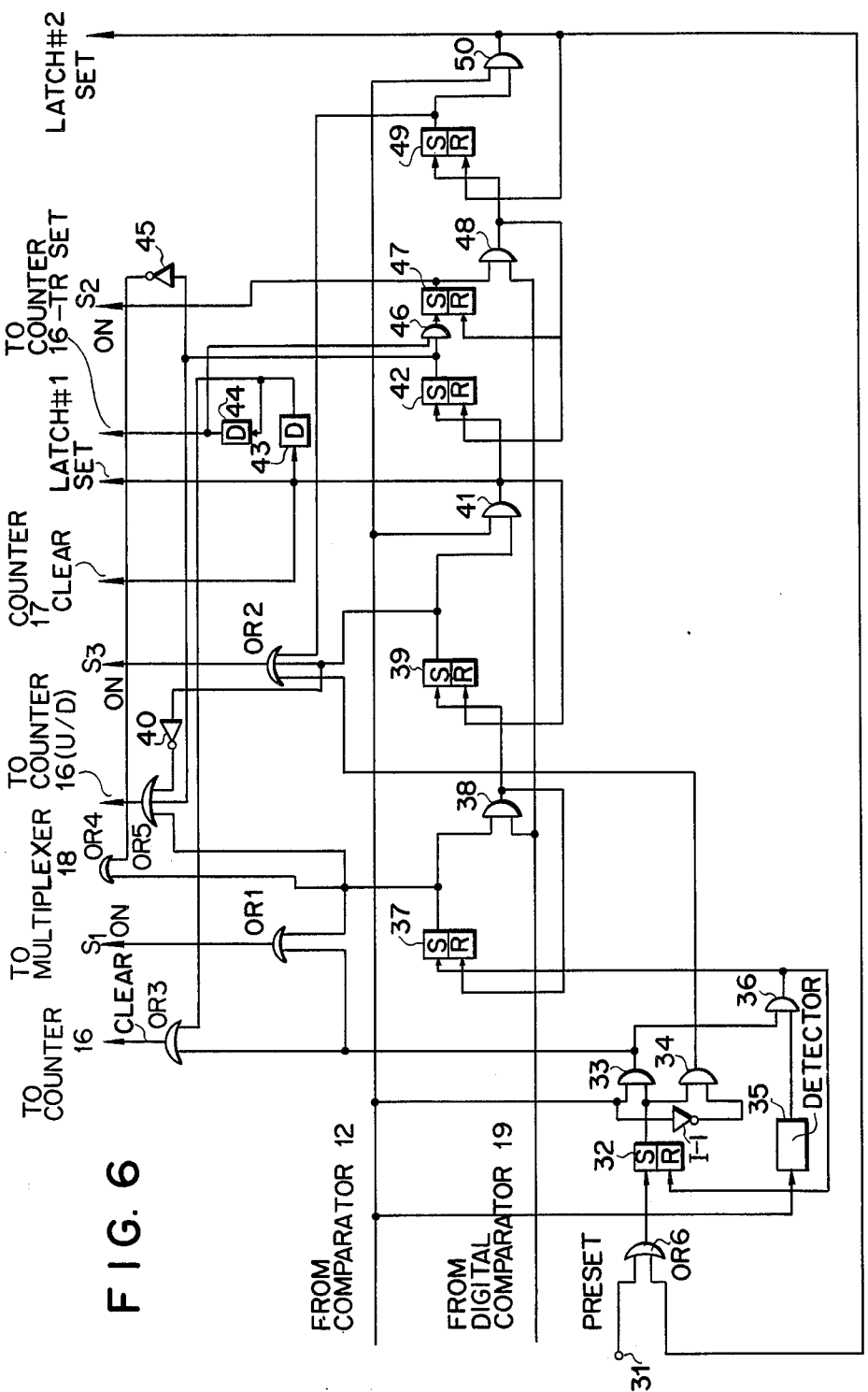
FIG. 6 is a circuit diagram showing an example of the gate control circuit of FIG. 4.

FIG. 6 shows an example of the gate control circuit 14 of FIG. 4. First, in order to perform the initial setting, the "1" signal is applied to a terminal 31. As a result, a flip-flop 32 is set, and since the comparator 12 produces the "1" signal if the output voltage $V_O$ of the integration circuit I is higher than the reference level $V_C$, an AND gate 33 is opened to permit the "1" signal to be sent to the analog switch $S_1$ through an OR gate $OR_1$. If, conversely, the $V_O$ is lower than the $V_C$, an AND gate 34 is opened through an inverter I-1 to permit the "1" signal to be supplied to the analog switch $S_3$ through an OR gate $OR_2$. The analog switches $S_1$ and $S_3$ are closed upon receipt of the "1" signal. The output of the AND gate 33 becoms a clear signal for the reversible counter 16 through an OR gate $OR_3$. When an edge detector 35 has detected that the output of the analog comparator 12 is "1", namely, that the $V_O$ has gone across the $V_C$, an AND gate 36 is opened to permit a flip-flop 37 to be set. The period $T_1$ begins at this point of time $t_0$. That is to say, when the flip-flop 37 is set, the flip-flop 32 is reset to cause the analog switch $S_1$ to be closed, and simultaneously the "1" signal is sent from the flip-flop 31 to the multiplexer 18 through an OR gate $OR_4$ and also to the reversible counter 16 through an OR gate $OR_5$. Upon receipt of this "1" signal, the multiplexer 18 transmits the content of the counter 17 to the digital comparator 19 and the reversible counter 16 is so set as to start its count-up operation.

When the time period $T_1$ elapses and the digital comparator 19 produces the "1" signal, an AND gate 38, since the flip-flop 37 is set, is opened to permit a flip-flop 39 to be set and simultaneously to permit the flip-flop 37 to be reset. When the flip-flop 39 is set, the output thereof is sent to the analog switch $S_3$ through the OR gate $OR_2$ to close the same $S_3$. Simultaneously, the output of the flip-flop 39 is inverted to a "0" signal by an inverter 40. As a result, the reversible counter 16 is so set as to start its count-down operation upon receipt of the output "0" from the OR gate $OR_5$. This point of time $t_2$ is a starting point of the $T_2$ period.

When the time period $T_2$ elapses and the output of the comparator 12 becomes "1", and AND gate 41, since the flip-flop 39 is placed in a set condition, is opened to permit a flip-flop 42 to be set and simultaneously to permit the flip-flop 39 to be reset. simultaneously, the "1" output signal of the AND gate 41 becomes a set signal for the first latch 20 and also a clear signal for the counter 17. The output signal of the AND gate 41 is delayed by the extent of one clock pulse by a delay circuit 43 to become a clear signal for the reversible counter 16 through the OR gate $OR_3$, and simultaneously further delayed by the extent of one clock pulse by a delay circuit 44 to become a set signal for the counter 16. Further, the set output of the flip-flop 42 is inverted by an inverter 45 and is transmitted to the multiplexer 18 through the OR gate $OR_4$. As a result, after a signal $(T_{1-T2})$ has been transferred to the first latch 20, the reversible counter 16 is cleared and thereafter a signal $-T_R$ is set to the reversible counter 16. At this time, an AND gate 46 is opened to permit a flip-flop 47 to be set. As a result, the analog switch $S_2$ is closed and the period $T_3$ is thus allowed to start at the point of time $t_2$.

Further, when the time period $T_3$ elapses and the digital comparator 19 produces the "1" signal, an AND gate 48 is opened to set a flip-flop 49 and simultaneously to reset the flip-flops 42 and 47. As a result, the set output of the flip-flop 49 is sent to the analog switch $S_3$ through the OR gate $OR_2$ to close the same $S_3$.

When the switch $S_3$ is closed and the input voltage $V_S$ is integrated to permit the analog comparator 12 to produce the "1" signal, an AND gate 50 is opened to permit the output signal thereof to become a set signal for the second latch 21 and also a reset signal for the flip-flop 49.

Through the above-mentioned operation of the gate control circuit 14, the operation control circuit 15 is controlled to permit the execution of various operations in the time periods $T_1$, $T_2$, $T_3$ and $T_4$. If, in this case, the "1" output signal of the AND gate 50 is fed back and used as an initial set signal through an OR gate $OR_6$, it will result that the foregoing operation is repeated over and over again, and for each repetition the content of the counter 17 is sequentially altered into a value permitting the difference between $(2T_R)$ and $(T_1 + T_2)$ to approach zero.

As above explained in detail, the A-D converter of the invention can automatically correct the errors resulting from the offset voltage of the integration circuit which have been an essential problem peculiar to the A-D converter of dual slope type, and since at this time the errors are handled not as analog amounts but as digital amounts, circuits necessary for error correction can be constituted all by digital circuits, so that the A-D converter of the invention is difficultly subject to yearly change or change with temperature and simultaneously easy to convert into an IC form, and can therefore carry out the error correction with high precision and stability and also be made compact.

Further, according to the invention, the error correction is additionally effected for each measurement and the correcting precision is sequentially enhanced for each increase in the frequency of measurement. Accordingly, the measuring errors can in principle be regarded as zero, and even the use of a D.C. amplifier whose offset voltage $\Delta$ is high makes it possible to obtain an A-D converter capable of providing an extremely high correcting precision. For instance, even if, in this case, the $\Delta$ accounts for 10% of the reference voltage, an 11-bit precision will be attained from the third and the immediately succeeding measurements.

Figure 7:
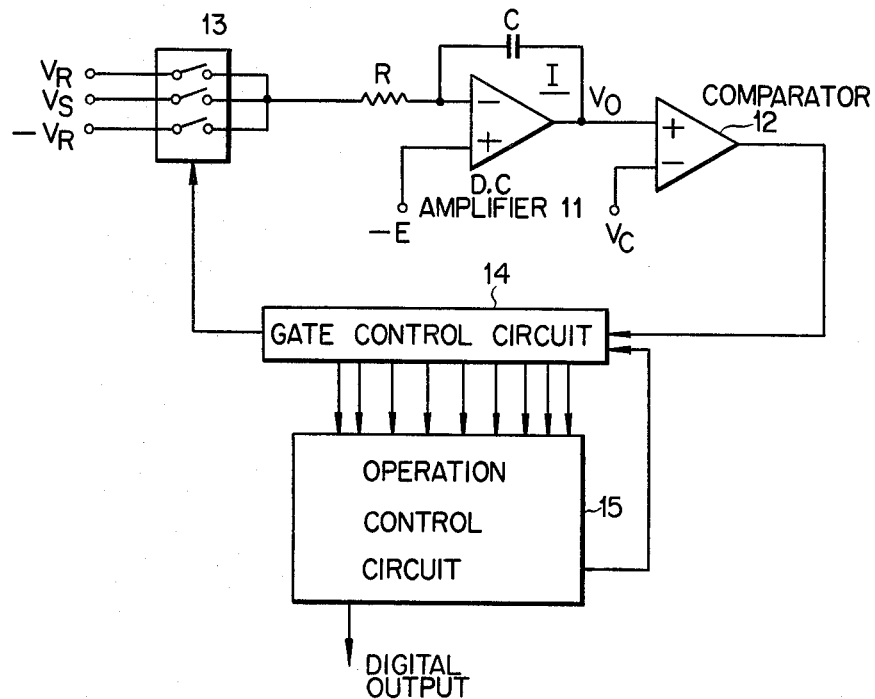
FIG. 7 is a block circuit diagram showing the A-D converter according to another embodiment of the invention.

FIG. 7 shows the A-D converter according to another embodiment of the invention. In this embodiment, a bias voltage $-E$ (the $-E$ has a level slightly lower than the earth voltage) is applied to the non-inversion input terminal of the D.C. amplifier 11. This means to purposely apply an offset voltage to the D.C amplifier 11. By so doing, there is eliminated a fear that the waveform of integration output voltage advances in the opposite direction even when the input voltage $V_S$ at the time of actual measurement is zero, thus to perform a stabler measurement. Since, according to the invention, the measuring errors can be converged to zero for each increase in the frequency of measurement, the effect of an increase in the offset voltage upon the measurement result can be neglected. The operation of the remaining parts and sections is the same as those of FIGS. 4 and 6.

Figure 9:
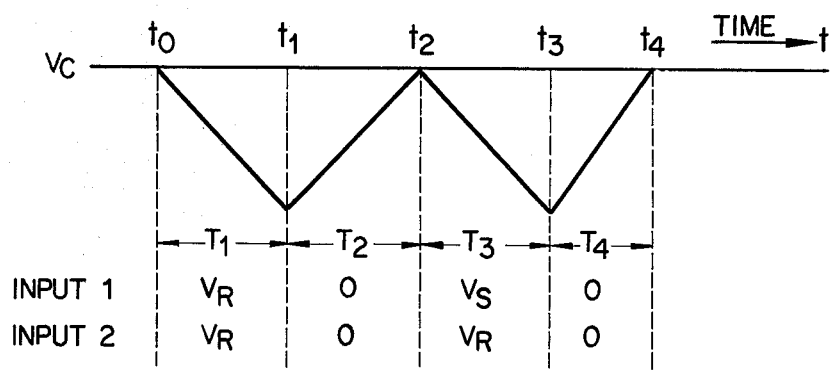
FIG. 9 is a graph for explaining the operation of the A-D converter of FIG. 8.
Figure 8:
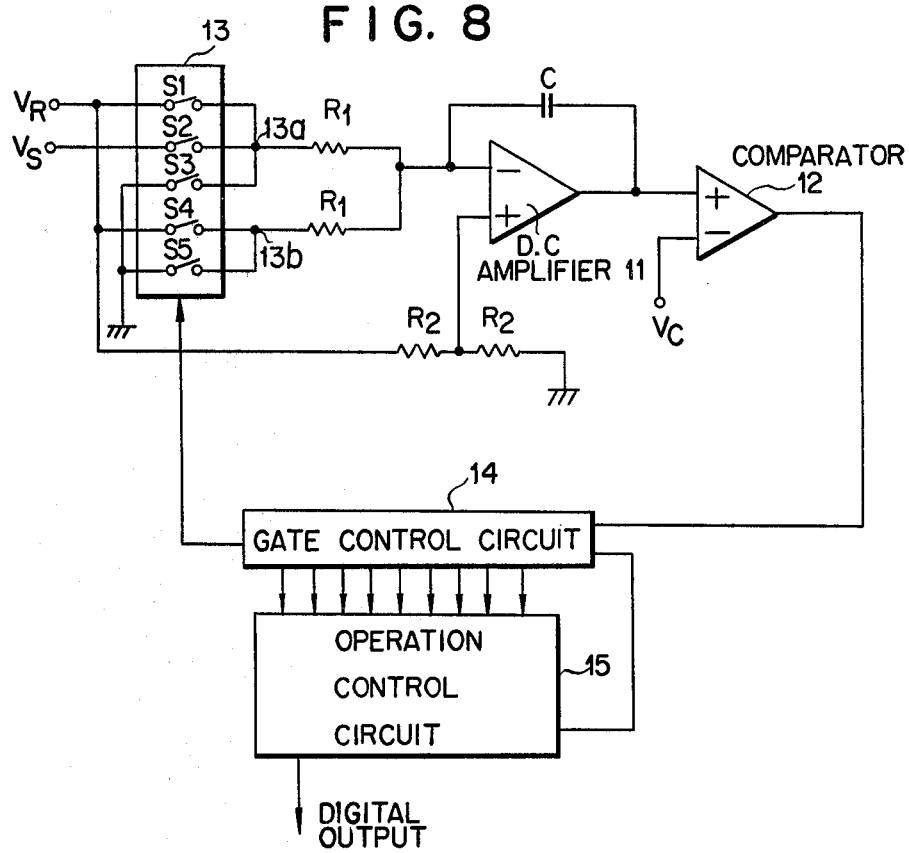
FIG. 8 is a block circuit diagram showing the A-D converter according to still another embodiment of the invention.

FIG. 8 shows the A-D converter according to still another embodiment of the invention. This embodiment refers to the case where the $V_R$ and the ground voltage 0 are used as the reference voltages. Five analog switches $S_1$ to $S_5$ are provided in the change-over switch 13. The reference voltage $V_R$ is applied to the analog switches $S_1$ and $S_4$, and the ground voltage 0 is applied to the analog switches $S_3$ and $S_5$, and the input voltage $V_S$ is applied to the analog switch $S_2$. A group of the switches $S_1$, $S_2$ and $S_3$ and a group of $S_4$ and $S_5$ are connected to two resistors $R_1$ and $R_1$, respectively. In the case of this embodiment, a voltage obtained through dividing the reference voltage $V_R$ by two resistors $R_2$ and $R_2$ is applied to the non-inversion input terminal of the D.C. amplifier 11. If, in the foregoing construction, control is made so that, as shown in FIG. 9, the analog switches $S_1$ and $S_4$ are closed in the $T_1$ period; the analog switches $S_3$ and $S_5$ are closed in the $T_2$, $T_4$ periods; and the analog switches $S_2$ and $S_4$ are closed in the $T_3$ period, completely the same description as that made with reference to FIG. 4 will result.

Namely, during the period $T_1$, the integration current $i$ is expressed as follows:

$$i = \frac{V_R - \frac{1}{2}V_R}{R_1} + \frac{V_R - \frac{1}{2}V_R}{R_1}$$

Therefore, $i = (V_R/R_1)$
During the periods $T_2$, $T_4$, said integration current $i$ is indicated as follows:

$$i = \frac{0 - \frac{1}{2}V_R}{R_1} + \frac{0 - \frac{1}{2}V_R}{R_1}$$

Therefore, $i = -(V_R/R_1)$
During the period $T_3$, the integration current $i$ is shown as follows:

$$i = \frac{V_R - \frac{1}{2}V_R}{R_1} + \frac{V_S - \frac{1}{2}V_R}{R_1} = \frac{V_S}{R_1}$$

Accordingly, this embodiment is little different from the case where an input shown in FIG. 5 is applied to the D.C. amplifier 11 in the embodiment of FIG. 4. Where the two resistors $R_1$, $R_1$ are used, combinations of referential voltages or input voltages being applied to said resistors $R_1$, $R_1$ are given in four numbers as shown in Table 2.

Table 2

| COMBINATION | | $T_1$ | $T_2$ | $T_3$ | $T_4$ |
|---|---|---|---|---|---|
| I | Input 1 | $V_R$ | 0 | $V_S$ | 0 |
| | Input 2 | $V_R$ | 0 | $V_R$ | 0 |
| II | Input 1 | $V_R$ | 0 | $V_S$ | $V_R$ |
| | Input 2 | $V_R$ | 0 | 0 | $V_R$ |
| III | Input 1 | 0 | $V_R$ | $V_S$ | $V_R$ |
| | Input 2 | 0 | $V_R$ | 0 | $V_R$ |
| IV | Input 1 | 0 | $V_R$ | $V_S$ | 0 |
| | Input 2 | 0 | $V_R$ | $V_R$ | 0 |

Figure 10:
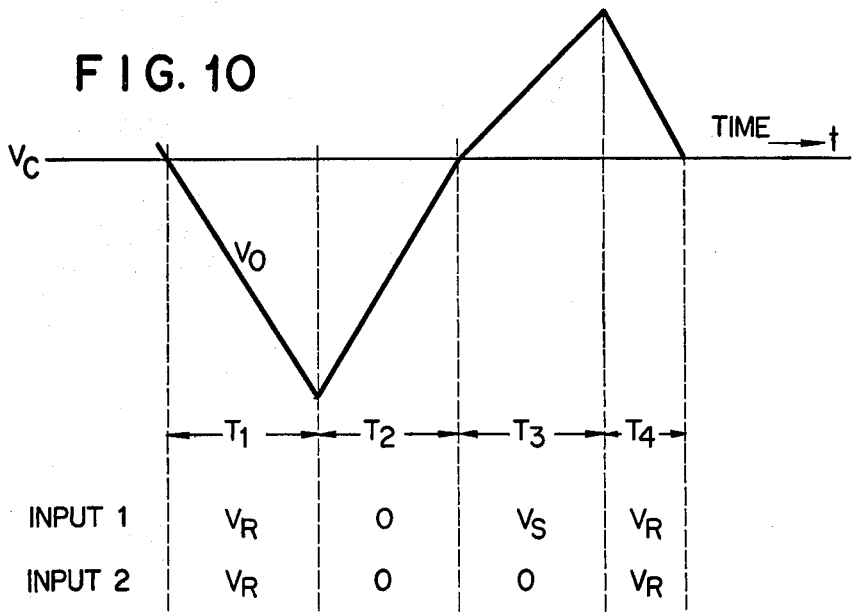
FIG. 10 is a graph for explaining the operation of the A-D converter of FIG. 8.

FIG. 9 represents the combination I. In the combination II, the output voltage $V_O$ of the D.C. amplifier 11 represents a level pattern illustrated in FIG. 10. With the embodiment of FIG. 8, a difference between the resistance values of the two resistors $R_2$, $R_2$ can be deemed as a change in the offset voltage of the D.C. amplifier 11, even if said resistance values are not rigidly equal.

FIG. 11 shows another modification of the arrangement of the operation control circuit 15. This modified circuit is applicable to any of the embodiments of FIGS. 4, 7 and 8, and has a simpler arrangement. There will now be described by reference to FIG. 12 the operation of the embodiment of FIG. 8 using said modified operation control circuit. Referring to FIG. 11, referential numeral 60 denotes a switch control circuit, which, upon receipt of the output of the comparator 12, controls the operation of the change-over switch assembly 13, the presetting of an updown counter 61 and the up- and down- counting. Referential numeral 62 denotes a shift register, which is stored with a count made by the counter 61, sends the stored count back to the counter 61 after a prescribed operation, and produces an output signal representing a value of A-D conversion.

Both input terminals 13a, 13b of FIG. 8 are supplied with the referential voltage $V_R$, and the updown counter 61 is preset at zero. This updown counter 61 counts clock pulses received through an AND gate 63 up to a prescribed number $N_1$. This counting interval represents the period $T_1$. When counting clock pulses up to the prescribed number $N_1$, the updown counter 61 delivers an output signal showing said number $N_1$ to the switch control 60 to control its operation, thereby causing both input terminals 13a, 13b to be impressed with a grounding voltage 0. At this point, the updown counter 61 is shifted from up- to down- counting. As the result, the updown counter 61 continues to count down said prescribed number $N_1$ successively, until said counter 61 recevies an output signal from the analog comparator 12. This interval corresponds to the period $T_2$. With the down counted number of clock pulses designated as $N_2$, the information stored in the updown counter 61 may be expressed as $N_1 - N_2 = -\Delta N$. A number $\Delta N$ thus obtained represents the time difference $\Delta T$. Thereafter a signal denoting $-\Delta N$ is transferred to a shift register 62, which in turn is shifted down by one bit to change the prefixed rotation of said $-\Delta N$, and sends the resultant signal back to the updown counter 61, namely to preset it at $\frac{1}{2}\Delta N$. With the input voltage $V_S$ alternated with the referential voltage $V_R$, the updown counter continues upcounting of clock pulses until the prescribed number $N_1$ is reached, namely, to an extent of $N_1 - (\Delta N/2 = N_3$. This number $N_3$ indicates the period $T_3$. When the updown counter 61 counts clock pulses up to the prescribed number $N_1$, the input voltage $V_S$ is again alternated with the referential voltage $V_R$. The updown counter 61 is preset at $-\Delta N/2$ and continues upcounting of clock pulses, until it receives an output signal from the analog comparator 12. A length of time required for the number $N_1$ to be counted up represents the period $T_4$. The information $(N_4 - (\Delta N/2)$ stored in the updown counter 61 is transferred to the shift register 62, which in turn delivers said information as a value of A-D conversion.

Further, in the foregoing explanation, the $T_1$ and $T_2$ are determined and in the next measurement the $T_3$ is set such that $T_3 = T_1 + \frac{1}{2}(2T_R - T_1 - T_2) = T_R + \frac{1}{2}(T_1 - T_2)$ in order that the $(T_1 + T_2)$ approaches $2T_R$ speedily, that is to say, arrangement is so made that a value obtained by adding $\frac{1}{2}(T_1 - T_2)$ to $T_R$ becomes $T_3$. But if the speediness of convergence is not questioned, arrangement may not be so made as to add $\frac{1}{2}(T_1 - T_2)$ itself to the $T_R$ but be so made as to add a smaller value to the $T_R$. Eventually, the $2T_R - T_1 - T_2$ can be made sequentially to approach an exact value simply by controlling so that the $2T_R - T_1 - T_2$ becomes $T_3$ ($T_1$ after correction) through adding or subtracting 1 count depending upon the plus or minus of the $2T_R - T_1 - T_2$. Though, in this case, the time necessary for convergence becomes longer, the control operation is easy and the control circuit is made simple in construction.

Further, the reversible counter used in FIGS. 4 and 11 can be replaced by two of the usual counters which are designed to make counts in one direction.

Normally, an output signal from the A-D converter is so designed as to cause the specified level range of an input signal extending from a maximum to a minimum value to correspond to a suitably chosen number S of digital steps. Namely, for example, a binary A-D converter is so designed that an output signal representing a minimum level of an input voltage $V_S$ is expressed as 0000 ... 000 and an output signal denoting a maximum level of said input voltage $V_S$ is indicated as 1111 ... 111. A number of levels intermediate between the maximum and minimum values is expressed by a digital step number of $S = (2^m - 1)$ (m denotes a number of bits constituting an output signal from the A-D converter).

Where, in the case of this invention, a maximum level of the input voltage $V_S$ is designated as $V_R$ and a minimum value level thereof as 0, namely, for example, $0 \leq V_S \leq V_R$ is assumed, then a desired value of A-D conversion is obtained with the period $T_1$ denoted by an S number of counted clock pulses. Further, where a maximum level of the input voltags $V_S$ is expressed as $J_{max} V_R$ and minimum level thereof as $J_{min} V_R$ (assuming $1 > J_{max} > J_{min} > 0$), then a required value of A-D conversion is obtained by subtracting a counted number of clock pulses expressed as $$\frac{J_{min} S}{J_{max} - J_{min}}$$

from a value of A-D conversion obtained with the period $T_1$ represented by a counted number of clock pulses expressed as $$T_1 = \frac{S}{J_{max} - J_{min}}.$$

The point is that a correct A-D conversion value can be provided by allotting a suitably chosen number of counted clock pulses to the period $T_1$ over the specified level range of an input voltage $V_S$, and, if necessary, a proper number of counted clock pulses is subtracted from an output signal from the A-D converter.

For elevation of the operational precision of the A-D converter, the periods $T_1$, $T_2$, $T_3$, $T_4$ should be measured with higher accuracy. Since, however, a length of time is determined by counting clock pulses, an error of at least one count is unavoidable. This problem can be resolved by multiplying a counted number of clock pulses by an integral multiplier (a preferred multiplier being any of multiples of 2, such as 2, 4, 8 ...) in measuring a length of time and dividing the multiplied counted number of clock pulses representing an output from the A-D converter by the same integral number as that used as a multiplier and taking the resultant quotient as a required value of A-D conversion.

It is noted that the previously described correction cycle in combination with previously described measuring cycle constitutes a measuring interval for the disclosed invention.

What we claim is:
1. An analog-to-digital converter comprising:
an integrator arranged to produce an integrated output corresponding to the magnitude of voltages applied thereto;
means to supply first and second reference voltages of substantially opposite polarities;
switch means for selectively applying the reference voltages and an input analog voltage to the input terminal of the integrator;
an analog comparator coupled to the output terminal of the integrator for producing a coincident signal when the integrator output is equal to a predetermined comparing voltage;
clock means for measuring clock pulses;
initiating means operative when the integrator output is equal to the comparing voltage;
first means to operate the switch means after being initiated by the initiating means to apply to the integrator the first reference voltage for a first time period $T_1$ as measured by the clock means;

second means to operate the switch means subsequent to the first time period $T_1$ to apply the second referece voltage to the input terminal of the integrator to cause the integrator output to return to the comparing voltage level and to measure a second time period $T_2$ until the analog comparator produces the coincident signal by the clock means;

a digital comparator for producing an equal signal or a not-equal signal corresponding to whether a period $(T_1 + T_2)$ equals a predetermined time period $2 T_R$ or not;

means for modifying the first time period $T_1$ when the digital comparator produces a not-equal signal and for repeating operations of the first and second means until the digital comparator produces an equal signal;

third means to operate the switch means after the digital comparator produces the equal signal to apply to the integrator the input analog voltage for a third time period $T_3$ so that the period $T_3$ is determined as the modified time period $T_1$ when the digital comparator produces the equal signal;

fourth means to operate the switch means subsequent to the third time period $T_3$ to apply the second reference voltage to the input terminal of the integrator until the analog comparator produces a coincident signal; and measuring means coupled to the output terminal of the comparator and to the clock means for producing an output digital signal representing the number of clock pulses occurring during the period the fourth means is operated.

2. An analog-to-digital converter as claimed in claim 1 wherein one of the first and second reference voltages is at ground level and the other voltage has the samd polarity as that of the input analog voltage.

3. In an analog-to-digital converter having an integrator which integrates an inlput analog voltage and a reference voltage which is successively applied, and means for producing a digital output signal corresponding to the input analog voltage during the conversion cycle;

the improvement which comprises:
means for supplying a reference voltage having the same polarity as the analog voltage;
first means for applying the reference voltage to the integrator for a first time period $T_1$ prior to the conversion cycle;
second means for applying the reference voltage to the integrator subsequent to the first time period $T_1$ for a second time period $T_2$;
clock means for producing clock pulses and measuring the time periods $T_1$, $T_2$ by counting the clock pulses;
a digital comparator for comparing a period $(T_1 + T_2)$ with a predetermined period $2T_R$ and producing a not-equal signal when the periods are not coincident with each other;
means for modifying the time period $T_1$ when the digital comparator produces a not-equal signal and for repeating operations during the same measuring interval relating to the first and second means to attain the relation of $T_1 + T_2 = 2T_R$.

4. An analog-to-digital converter as claimed in claim 3 wherein the modified time period $T_1$ is determined as $$T_1^{(n+1)} = T_R + \tfrac{1}{2}(T_1^{(n)} - T_2^{(n)})$$

wherein $n$ denotes the times of the operations relating to the first and second means.

5. An analog-to-digital converter as claimed in claim 4 wherein the period $T_1^{(n+1)}$ is also used as the time period in which the input analog voltage is applied to the integrator on the conversion cycle.

6. An analog-to-digital converter comprising:
means for supplying first and second reference voltages having the same polarity as an input analog voltage;
first and second integration resistors;
a D.C. amplifier having an inversion input terminal connected to the integration resistors and a non-inversion input terminal to which is applid a voltage having an intermediate value between the value of the first reference voltage and the second reference voltage;
an integration capacitor connected between an output terminal of the D.C. amplifier and the inversion input terminal;
an analog comparator having one input terminal connected to the output terminal of the D.C. amplifier and another input terminal to which is applied a comparing reference voltage;
switch means for selectively applying the first and second reference voltages and the input analog voltage to the integration resistors;
first means to operate the switch means when the integrator output is equal to the comparing reference voltage level to apply to the integration resistors the first reference voltage for a first time period $T_1$ to cause the integrator output to move away from the comparing reference voltage level;
second means to operate the switch means subsequent to the first time period $T_1$ to apply the second reference voltage to the integration resistors to cause the integrator output to return to the comparing reference voltage level for a second time period $T_2$ which terminates when the analog comparator produces an output signal;
means for producing clock pulses and determining the time period $T_1$ by counting the clock pulses and measuring a difference value between the period $T_1$ and the period $T_2$;
control means for setting a new time period as the period $T_1$ added by half of the difference value and operating the first and second means repeatedly during the same measuring interval using the new time period as period $T_1$ until the difference value approaches the zero level;
third means to operate the switch means to apply the input analog voltage and one of the reference voltages to the first and second integration for a third time period $T_3$ which is determined as $T_1$ when the difference value is zero;
fourth means to operate the switch means to apply the other of the reference voltages to the integration resistors subsequent to the third time period $T_3$ during a fourth time period $T_4$ which terminates when the analog comparator produces an output signal; and
means for producing an output digital signal repsenting the number of clock pulses occurring during the fourth time period.

7. An analog-to-digital converter as claimed in claim 6 wherein one of the reference voltages is at ground level and the other has the same polarity as the input analog voltage $V_R$.

8. Apparatus as claimed in claim 7 wherein the period $T_1$ is determined as $$T_1 = \frac{S}{J_{max} - J_{min}}$$

where S is the number of digital steps and further comprising;

means for obtaining an A-D conversion value by subtracting a value $$\frac{J_{min} S}{J_{max} - J_{min}}$$

from the output digital signal in order to cause the specified S-step range of the A-D conversion value corresponding to the input analog voltage to extend for a maximum level to a minimum level, the coefficients $J_{max}$, $J_{min}$ being determined as follows; when the input analog voltage $V_S$ is in the range of $$J_{min} V_R \leq V_S \leq J_{max} V_R \, (1 > J_{max} > J_{min} > 0)$$

where $J_{max} V_R$ is a maximum level of the input analog voltage $V_X$ and $J_{min} V_R$ is a minimum level of the input analog voltage $V_S$.

9. A method for converting an analog signal to a digital signal wherein during a measuring cycle the input analog voltage and the reference voltage are controllably applid to an integrator and a digital output is obtained corresponding to the input analog voltage; the method having a correcting cycle prior to the measuring cycle in which the reference voltages are controllably applied to the integrator to reduce the error in the output resulting from the offset voltage of the integrator and the like;

the improvement of the correcting cycle comprising the steps of (a) applying a first reference voltage to the integrator for a first time period $T_1$ to cause the output of the integrator ramp to move away from a comparing level;

(b) applying a second reference voltage having a polarity substantially opposite to the first reference voltage to the integrator successively to the time period $T_1$ to cause the output of the integrator to return to the comparing level;

(c) measuring the time period as a second time period $T_2$ between the time step (b) is operated and the time when the output of the integrator coincides with the comparing level;

(d) detecting the difference between the time periods $T_1$ and $T_2$;

(e) setting the time period $T_1$ as $$T_R + \tfrac{1}{2}(T_1 - T_2),$$

when the difference is detected by step (d) where $T_R$ is a predetermined time period; and (f) repeating steps (a) to (e) during the same measuring interval until the following relation is attained $$T_1 + T_2 = 2T_R.$$

10. A method according to claim 9 wherein the correcting cycle is continuously repeated after the measuring cycle is terminated.

11. A method according to claim 9 wherein the correcting cycle is continuously repeated except during the period when the measuring cycle is performed.

* * * * *